United States Patent
Hasegawa et al.

(10) Patent No.: US 10,829,848 B2
(45) Date of Patent: *Nov. 10, 2020

(54) MAGNETIC RECORDING MEDIUM, WITH CARBIDE SEGREGANT, METHOD FOR MANUFACTURING SAME AND MAGNETIC RECORDING AND REPRODUCING APPARATUS

(71) Applicant: SHOWA DENKO K.K., Tokyo (JP)

(72) Inventors: Kota Hasegawa, Chiba (JP); Haruhisa Ohashi, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 169 days.

This patent is subject to a terminal disclaimer.

(21) Appl. No.: 15/844,717

(22) Filed: Dec. 18, 2017

(65) Prior Publication Data

US 2018/0174605 A1 Jun. 21, 2018

(30) Foreign Application Priority Data

Dec. 21, 2016 (JP) ................................. 2016-248259

(51) Int. Cl.
*C23C 14/08* (2006.01)
*C23C 14/00* (2006.01)
(Continued)

(52) U.S. Cl.
CPC .......... *C23C 14/08* (2013.01); *C23C 14/0036* (2013.01); *C23C 14/185* (2013.01);
(Continued)

(58) Field of Classification Search
None
See application file for complete search history.

(56) References Cited

U.S. PATENT DOCUMENTS

| | | | |
|---|---|---|---|
| 6,667,284 B2 * | 12/2003 | Gunsel | C07C 69/63 508/463 |
| 7,531,248 B1 * | 5/2009 | Nolan | G11B 5/65 360/131 |

(Continued)

FOREIGN PATENT DOCUMENTS

| | | |
|---|---|---|
| CN | 1841512 | 10/2006 |
| JP | 2001-291230 | 10/2001 |

(Continued)

OTHER PUBLICATIONS

Office Action dated Apr. 17, 2020 issued with respect to the related U.S. Appl. No. 15/831,579.

*Primary Examiner* — Kevin M Bernatz
(74) *Attorney, Agent, or Firm* — IPUSA, PLLC

(57) ABSTRACT

A magnetic recording medium includes a non-magnetic substrate, a soft magnetic underlayer, an orientation control layer, a perpendicular magnetic layer, and a protective layer arranged in this order. The perpendicular magnetic layer includes a first magnetic layer and a second magnetic layer from the non-magnetic substrate side in this order. The second magnetic layer contains a magnetic grain and provided farthest from the non-magnetic substrate. The first magnetic layer has a granular structure that contains an oxide in a grain boundary. The second magnetic layer has a granular structure that contains a carbide of an element contained in the magnetic grain in a grain boundary.

9 Claims, 3 Drawing Sheets

(51) Int. Cl.

| | |
|---|---|
| *C23C 28/00* | (2006.01) |
| *C23C 14/35* | (2006.01) |
| *G11B 5/851* | (2006.01) |
| *G11B 5/82* | (2006.01) |
| *G11B 5/65* | (2006.01) |
| *C23C 14/18* | (2006.01) |
| *G11B 5/66* | (2006.01) |

(52) U.S. Cl.
CPC ............ *C23C 14/35* (2013.01); *C23C 14/351* (2013.01); *C23C 28/00* (2013.01); *C23C 28/321* (2013.01); *C23C 28/322* (2013.01); *C23C 28/345* (2013.01); *C23C 28/3455* (2013.01); *G11B 5/65* (2013.01); *G11B 5/656* (2013.01); *G11B 5/66* (2013.01); *G11B 5/82* (2013.01); *G11B 5/851* (2013.01)

(56) References Cited

U.S. PATENT DOCUMENTS

| | | | | |
|---|---|---|---|---|
| 7,892,663 | B2* | 2/2011 | Nakagawa | G11B 5/65 360/131 |
| 8,507,114 | B2* | 8/2013 | Peng | G11B 5/73 428/827 |
| 8,580,410 | B2* | 11/2013 | Onoue | G11B 5/65 428/829 |
| 8,804,285 | B2* | 8/2014 | Takahoshi | G11B 5/66 360/135 |
| 9,324,353 | B2* | 4/2016 | Hellwig | G11B 5/66 |
| 2001/0036564 | A1 | 11/2001 | Ohmori | |
| 2006/0204791 | A1* | 9/2006 | Sakawaki | G11B 5/65 428/828.1 |
| 2006/0222902 | A1 | 10/2006 | Mukai | |
| 2007/0248843 | A1* | 10/2007 | Wu | G11B 5/66 428/827 |
| 2010/0009218 | A1* | 1/2010 | Reiter | G11B 5/65 428/829 |
| 2010/0165510 | A1 | 7/2010 | Takahashi et al. | |
| 2012/0019959 | A1* | 1/2012 | Kurita | G11B 5/65 360/110 |
| 2012/0052330 | A1* | 3/2012 | Takekuma | G11B 5/84 428/829 |
| 2012/0225325 | A1* | 9/2012 | Nemoto | G11B 5/66 428/829 |
| 2014/0376127 | A1* | 12/2014 | Kanbe | G11B 5/7325 360/110 |
| 2014/0377590 | A1* | 12/2014 | Uchida | G11B 5/743 428/829 |
| 2015/0138939 | A1* | 5/2015 | Hellwig | G11B 5/65 369/13.41 |
| 2016/0118071 | A1* | 4/2016 | Hirotsune | G11B 5/3133 360/75 |
| 2016/0148632 | A1* | 5/2016 | Hellwig | G11B 5/65 360/75 |
| 2018/0166100 | A1* | 6/2018 | Hasegawa | G11B 5/65 |

FOREIGN PATENT DOCUMENTS

| | | |
|---|---|---|
| JP | 2004-022082 | 1/2004 |
| JP | 2006-277950 | 10/2006 |
| JP | 2008-287829 | 11/2008 |

* cited by examiner

| | FIRST MAGNETIC LAYER | SECOND MAGNETIC LAYER | SNR [dB] | CORROSION SPOT [NUMBER / SURFACE] |
|---|---|---|---|---|
| WORKING EXAMPLE 1 | 92(Co11Cr18Pt)-5(SiO$_2$)-3(TiO$_2$) | 97(Co12Cr22Pt2B)-3(B$_4$C) | 8.0 | 30 |
| WORKING EXAMPLE 2 | 92(Co11Cr18Pt)-5(SiO$_2$)-3(TiO$_2$) | 93(Co12Cr22Pt7Ti)-7(TiC) | 7.8 | 30 |
| WORKING EXAMPLE 3 | 92(Co11Cr18Pt)-5(SiO$_2$)-3(TiO$_2$) | 97(Co12Cr22Pt2Al)-3(Al$_4$C$_3$) | 7.8 | 40 |
| WORKING EXAMPLE 4 | 92(Co11Cr18Pt)-5(SiO$_2$)-3(TiO$_2$) | 93(Co12Cr22Pt7Ta)-7(TaC) | 7.8 | 40 |
| WORKING EXAMPLE 5 | 92(Co11Cr18Pt)-5(SiO$_2$)-3(TiO$_2$) | 93(Co12Cr22Pt7Zr)-7(ZrC) | 7.7 | 35 |
| WORKING EXAMPLE 6 | 92(Co11Cr18Pt)-5(SiO$_2$)-3(TiO$_2$) | 93(Co12Cr22Pt7Si)-7(SiC) | 7.7 | 35 |
| COMPARATIVE EXAMPLE 1 | 92(Co11Cr18Pt)-5(SiO$_2$)-3(TiO$_2$) | Co10Cr20Pt14B | 7.6 | 40 |
| COMPARATIVE EXAMPLE 2 | 92(Co11Cr18Pt)-5(SiO$_2$)-3(TiO$_2$) | 92(Co11Cr18Pt)-5(SiO$_2$)-3(TiO$_2$) | 7.1 | 100 |

FIG.4

MAGNETIC RECORDING MEDIUM, WITH CARBIDE SEGREGANT, METHOD FOR MANUFACTURING SAME AND MAGNETIC RECORDING AND REPRODUCING APPARATUS

CROSS-REFERENCE TO RELATED APPLICATIONS

This application is based upon and claims priority to Japanese Patent Application No. 2016-248259 filed on Dec. 21, 2016, the entire contents of which are incorporated herein by reference.

BACKGROUND OF THE INVENTION

1. Field of the Invention

The present invention relates to a magnetic recording medium, a method for manufacturing a magnetic recording medium and a magnetic recording and reproducing apparatus.

2. Description of the Related Art

Hard disc drives (HDD) are one kind of magnetic recording and reproducing apparatus. Their recording density has dramatically increased at present, and this trend continues. Hence, development of magnetic recording mediums and magnetic recording heads appropriate for high recording density is promoted.

At present, magnetic recording mediums mounted on commercially supplied magnetic recording and reproducing apparatuses are so-called perpendicular magnetic recording mediums that include perpendicular magnetic layers in which easy axes of magnetization are mainly oriented perpendicular to surfaces of non-magnetic substrates. Here, the perpendicular magnetic layers have hcp structures, and their (0002) planes are mainly oriented parallel to the surfaces of the non-magnetic substrates. The perpendicular magnetic recording mediums prevent an increase in noise because the perpendicular magnetic recording mediums are hardly affected by diamagnetic fields in boundary regions between recording bits, and because clear recording bit boundaries are formed even when the recording density increases. Moreover, the perpendicular magnetic recording mediums have high tolerances to the effects of thermal fluctuations because the volumes of recording bits do not decrease so much even when the recording density increases. Therefore, a variety of structures of the perpendicular magnetic recording mediums are proposed.

Magnetic layers having granular structures are used for the magnetic layers of the perpendicular magnetic recording mediums.

The magnetic layer having the granular structure has a structure in which a magnetic crystal grain is surrounded by a grain boundary of a non-magnetic and non-metal substance such as an oxide or a nitride. Thus, because the grain boundary of the non-magnetic and non-metal substance physically separates the magnetic grains from each other, a magnetic interaction between the magnetic grains lowers, and formation of a zigzag magnetic wall in a transition range of the recording bit is inhibited, thereby enhancing noise properties.

On the other hand, the magnetic layer having the granular structure is likely to precipitate Co atoms and the like contained in the magnetic layer, which deteriorates corrosion resistance of the magnetic recording mediums.

To prevent this, Japanese Laid-Open Patent Application Publication No. 2006-277950 discloses a structure of using a magnetic layer using a non-granular structure as the outermost magnetic layer constituting a magnetic recording medium.

In the meantime, Japanese Laid-Open Patent Application Publication No. 2004-22082 discloses a magnetic recording medium using boron carbide ($B_4C$) at grain boundaries of a magnetic layer having a granular structure.

As discussed above, many magnetic recording mediums have used the magnetic layers having the granular structure to improve the noise properties while using the magnetic layers having the non-granular structure as the outermost magnetic layer to improve the corrosion resistance properties. This hinders the improvement of the noise properties of the magnetic recording medium and an increase in recording density of the magnetic recording medium because the outermost magnetic grains of the magnetic layer become greater than the magnetic grains of inner layers.

SUMMARY OF THE INVENTION

Embodiments of the present invention may provide a magnetic recording medium that has preferable noise properties and is appropriate for an increase in recording density.

According to an embodiment of the present invention, there is provided a magnetic recording medium that includes a non-magnetic substrate, a soft magnetic underlayer provided over the non-magnetic, an orientation control layer provided over the soft magnetic underlayer, a perpendicular magnetic layer provided over the orientation control layer, and a protective layer over the perpendicular magnetic layer. A first magnetic layer is provided in the perpendicular magnetic layer and having a granular structure that contains an oxide in a grain boundary. A second magnetic layer that contains a magnetic grain is provided farthest from the non-magnetic substrate in the perpendicular magnetic layer. The second magnetic layer has a granular structure that contains a carbide of an element contained in the magnetic grain in a grain boundary.

According to another embodiment of the present invention, there is provided a method for manufacturing a magnetic recording medium including a non-magnetic substrate, a soft magnetic underlayer, an orientation control layer, a perpendicular magnetic layer, and a protective layer arranged in this order. In the method, a first magnetic layer is formed over the orientation control layer as part of the perpendicular magnetic layer by sputtering such that the first magnetic layer has a granular structure that contains an oxide in a grain boundary. A second magnetic layer having a non-magnetic structure and containing a magnetic grain is formed at a location farthest from the orientation control layer in the perpendicular magnetic layer by sputtering. Part of an element contained in the magnetic grain is changed into a carbide so that a grain boundary is formed and thereby the second magnetic layer has a granular structure by causing the second magnetic layer having the non-magnetic structure to react with carbon.

According to another embodiment of the present invention, there is provided a recording medium that includes a non-magnetic substrate, a soft magnetic underlayer provided over the non-magnetic, an orientation control layer provided over the soft magnetic underlayer, a perpendicular magnetic layer provided over the orientation control layer, and a protective layer over the perpendicular magnetic layer. A first magnetic layer is provided in the perpendicular magnetic layer and having a granular structure that contains an oxide in a grain boundary. A second magnetic layer that contains a magnetic grain is provided farthest from the non-magnetic substrate in the perpendicular magnetic layer. The second magnetic layer has a granular structure that contains a carbide of an element contained in the magnetic grain in a grain boundary. A magnetic head is configured to record information in the recording medium and to reproduce the recorded information from the magnetic recording medium.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 4 is a table showing results of working examples and comparative examples.

DESCRIPTION OF THE PREFERRED EMBODIMENTS

A magnetic recording medium, a method for manufacturing the same and a magnetic recording and reproducing apparatus according to the embodiments of the present invention is described below with reference to the accompanying drawings.

Figure 1:
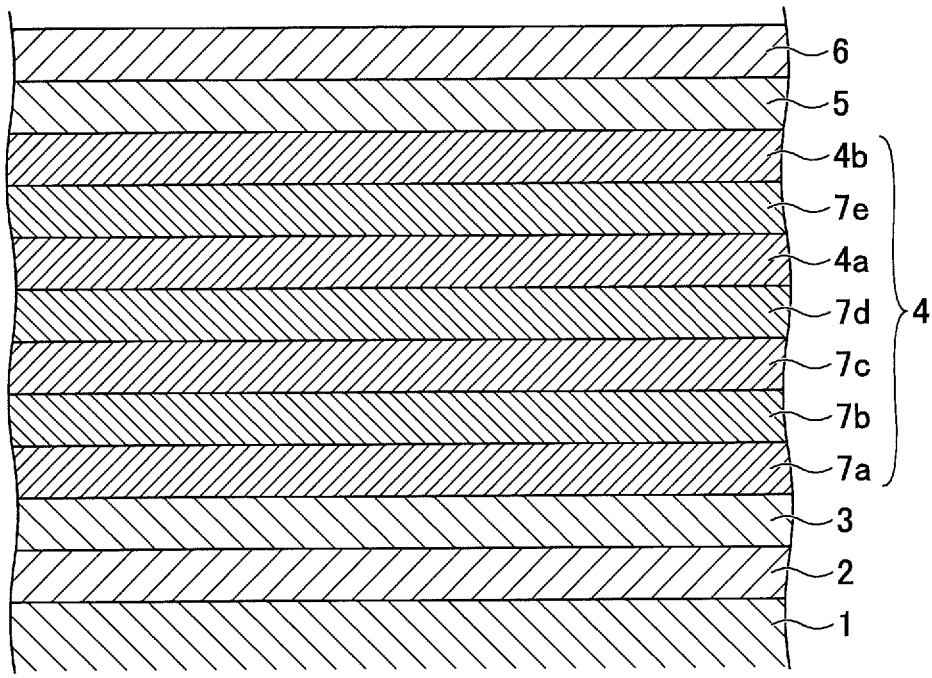
FIG. 1 is a vertical cross-sectional view illustrating a structure of an example of a magnetic recording medium according to an embodiment.

FIG. 1 illustrates a structure of an example of a magnetic recording medium of the present embodiment.

A magnetic recording medium 10 includes a soft magnetic underlayer 2, an orientation control layer 3, a perpendicular magnetic layer 4, a protective layer 5, and a lubricating layer 6 on a non-magnetic substrate 1 arranged in this order.

Figure 2:
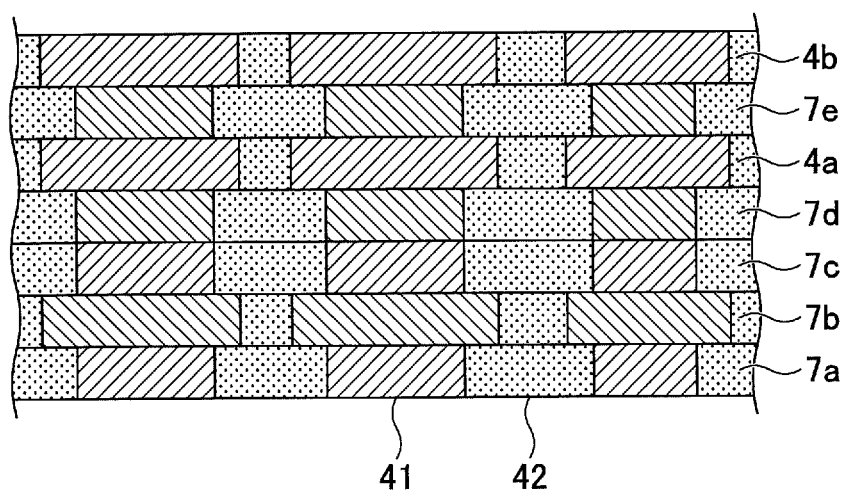
FIG. 2 is a vertical cross-sectional view illustrating a structure of a perpendicular magnetic layer of FIG. 1.

The perpendicular magnetic layer 4 includes a first magnetic layer 4a and a second magnetic layer 4b arranged from a side of the non-magnetic substrate 1 in this order, and further includes any magnetic layers or non-magnetic layers 7a, 7b, 7c, 7d and 7e. As illustrated in FIG. 2, the perpendicular magnetic layer 4 forms a columnar crystal made of magnetic grains or non-magnetic grains 41 that continues from the lower layer to the upper layer. Each grain boundary 42 of the first magnetic layer 4a contains an oxide, and each grain boundary 42 of the second magnetic layer 4b contains a carbide.

Here, the grain boundary 41 is a magnetic grain in the first magnetic layer 4a and the second magnetic layer 4b. When numerals 7a, 7b, 7c, 7d and 7e are magnetic layers (or non-magnetic layers), the grain boundaries 41 are magnetic layers (or a non-magnetic layer).

A metal substrate made of a metal material such as aluminum and an aluminum alloy may be used as the non-magnetic substrate 1, or a non-magnetic substrate made of a non-metallic material such as glass, ceramics, silicon, silicon carbide and carbon may be used as the non-magnetic substrate 1.

The metal substrate and the non-metal substrate on which NiP layer or a NiP alloy layer is formed by plating or sputtering may be also used as the non-magnetic substrate 1.

The soft magnetic underlayer 2 is provided to increase a perpendicular component relative to the non-magnetic substrate 1 of a magnetic flux generated from a magnetic head and to firmly fix a direction of an easy axis of magnetization of the perpendicular magnetic layer 4 perpendicular to the non-magnetic substrate 1. This action more outstands when a monopole head for perpendicular recording is used as a magnetic head for recording.

A material that forms the soft magnetic underlayer 2 is not limited to a specific material, and a soft magnetic material containing Fe, Ni and/or Co can be used.

For example, a CoFe based alloy (CoFeTaZr, CoFeZrNb and the like), a FeCo based alloy (FeCo, FeCoV and the like), a FeNi based alloy (FeNi, FeNiMo, FeNiCr, FeNiSi and the like), a FeAl based alloy (FeAl, FeAlSi, FeAlSiCr, FeAlSiTiRu, FeAlO and the like), a FeCr based alloy (FeCr, FeCrTi, FeCrCu and the like), a FeTa based alloy (FeTa, FeTaC, FeTaN and the like), a FeMg based alloy (FeMgO and the like), FeZr based alloy (FeZrN and the like), a FeC based alloy, a FeN based alloy, a FeSi based alloy, a FeP based alloy, a FeNb based alloy, a FeHf based alloy, a FeB based alloy and the like can be taken as examples of the soft magnetic material.

The soft magnetic underlayer 2 is preferably constituted of two soft magnetic layers, and a Ru film is preferably provided between the two soft magnetic layers.

The thickness of the Ru film is preferably adjusted to a range of 0.4 to 1.0 nm, or 1.6 to 2.6 nm. Thus, the two soft magnetic layers can be made an AFC (AntiFerromagnetic Coupling) structure, thereby preventing a so-called spike noise.

An adhesion layer is preferably provided between the non-magnetic substrate 1 and the soft magnetic underlayer 2. Thus, the non-magnetic substrate 1 contacts the soft magnetic underlayer 2 that contains Co or Fe, which can prevent corrosion caused by a gas adsorbed on a surface of the non-magnetic substrate 1, an impact of moisture, or diffusion of a component constituting the non-magnetic substrate 1.

For example, Cr, a Cr alloy, Ti and a Ti alloy can be cited as a material to form the adhesion layer.

The thickness of the adhesion layer is preferably made 30 Å or thicker.

The orientation control layer 3 controls an orientation of the perpendicular magnetic layer 4. More specifically, by mainly orienting the (0002) plane of the perpendicular magnetic layer 4 having the hcp structure parallel to the surface of the non-magnetic substrate 1 and miniaturizing the magnetic grains of the perpendicular magnetic layer 4, recording and reproducing properties of the perpendicular magnetic layer 4 can be improved.

A material that forms the orientation control layer 3 is not limited to a specific material, but is preferred to have the hcp structure, an fcc structure, or an amorphous structure.

For example, a Ru based alloy, a Ni based alloy, a Co based alloy, a Pt based alloy, a Cu based alloy and the like can be cited as a material to form the orientation control layer 3.

Here, the orientation control layer 3 can be configured by forming these alloys into multiple layers. In this case, for example, the orientation control layer 3 is preferred to have a multi-layer structure of the Ni based alloy and the Ru based alloy, a multi-layer structure of the Co based ally and the Ru based alloy, or a multi-layer structure of the Pt based alloy and the Ru based alloy, layered and sequentially stacked from the side of the non-magnetic substrate 1.

The perpendicular magnetic layer 4 has the hcp structure, and the (0002) plane is principally oriented parallel to the surface of the non-magnetic substrate 1, and the easy axis of magnetization is principally oriented perpendicular to the non-magnetic substrate 1. Moreover, the perpendicular magnetic layer 4 includes the first magnetic layer 4a and the second magnetic layer 4b in this order from the side of the non-magnetic substrate 1. The second magnetic layer 4b is the outermost magnetic layer. The first magnetic layer 4a is a magnetic layer having a granular structure and containing an oxide in grain boundaries 42. The second magnetic layer 4b is a magnetic layer having a granular structure that contains a carbide in grain boundaries 42. The carbide is made of a carbide of an element contained in the magnetic grains of the second magnetic layer 4b.

The first magnetic layer 4a is a magnetic layer that has the granular structure and contains the oxide in the grain boundaries 42, and has a structure that has a magnetic crystal grain surrounded by the oxide. Thus, because the grain boundaries 42 of the oxide physically separate the magnetic grains 41 from each other, a magnetic interaction between the magnetic grains 41 decreases, and formation of a zigzag magnetic wall that occurs in a transition region of a recording bit is prevented, which makes it possible to obtain low noise properties.

Conventionally, a non-metal and non-magnetic material such as an oxide, a nitride, a carbide, and a boride, is used in the grain boundaries of the magnetic layer having the granular structure. The investigation of the invention has indicated that, when forming the magnetic layer having the granular structure by sputtering, because the oxide has the highest reactive properties, the oxide makes it easier to perform film deposition, to physically separate the magnetic grains form each other, and to allow the magnetic interaction between the magnetic grains to decrease.

To form such a structure by sputtering, a content of the oxide in the first magnetic layer 4a and film deposition conditions of the first magnetic layer 4a are important.

The content of the oxide in the first magnetic layer 4a is preferably not less than 3 mol % and not more than 18 mol %, and further preferably not less than 6 mol % and not more than 13 mol % of a total molar quantity calculated by viewing materials constituting the magnetic grain, for example, an alloy constituted of Co, Cr, Pt and the like, as a single compound.

The reason why the content of the oxide in the first magnetic layer 4a is preferably not less than 3 mol % and not more than 18 mol % is that, as illustrated in FIG. 2, when forming the perpendicular magnetic layer 4, the oxide is likely to precipitate in the grain boundaries 42 surrounding the magnetic grains 41, which makes it easier to isolate and miniaturize the magnetic grains 41. When the content of the oxide in the first magnetic layer 4a is 18 mol % or lower, the oxide is unlikely to remain in the magnetic grains 41, and as a result, the orientation properties and the crystalline nature are not undermined. Moreover, the oxide is unlikely to precipitate above and below the magnetic grains 41, and as a result, the columnar structure in which the magnetic grains 41 penetrate the perpendicular magnetic layer 4 from the top to the bottom is formed. In addition, when the content of the oxide in the first magnetic layer 4a is 3 mol % or higher, the magnetic grains 41 are readily isolated and miniaturized, and as a result, the noise during the recording and reproduction can be reduced, and a signal/noise ratio (S/N ratio) appropriate for an increase in recording density can be obtained.

The oxide contained in the grain boundaries 42 of the first magnetic layer 4a is preferably an oxide of silicon, chrome, titanium, titanium, aluminum, yttrium, boron, magnesium, tungsten, or cobalt.

For example, $CoCrPt—SiO_2$, $CoCrPtNb—Cr_2O_3$, $CoCrPt—Ta_2O_5$, $CoCrPt—Cr_2O_3—TiO_2$, $CoCrPt—Cr_2O_3—SiO_2$, $CoCrPt—Cr_2O_3—SiO_2—TiO_2$, $CoCrPtMo—TiO_2$, $CoCrPtW—TiO_2$, $CoCrPtB—Al_2O_3$, $CoCrPtTaNd—MgO$, $CoCrPtBCu—Y_2O_3$, and $CoCrPtRu—SiO_2$ can be cited as a material to form the first magnetic layer 4a.

The second magnetic layer 4b is the outermost magnetic layer and has a granular structure containing a carbide in the grain boundaries. As discussed above, many magnetic layers having the granular structure are used in the magnetic recording medium, and the magnetic layer having a non-granular structure is used as the outermost magnetic layer due to the necessity for improving the corrosion resistance. Thus, the outermost magnetic layer having the non-granular structure has prevented the improvement of the noise properties of the magnetic recording medium, and the outermost magnetic grains of the magnetic layer becomes greater than the magnetic grain in the lower layer side, which has prevented the increase in recording density of the magnetic recording medium.

In the present embodiment, the second magnetic layer 4b having the granular structure containing a carbide in the grain boundaries 42 is used as the outermost magnetic layer. Because the carbide is more stable than the oxide, the corrosion resistance of the magnetic recording medium 10 can be improved. Also, because the second magnetic layer 4b has the granular structure, the magnetic grains can be isolated and made finer similar to the first magnetic layer 4a, the noise properties of the magnetic recording medium 10 can be improved.

On the other hand, as discussed above, because the carbides are stable and low-reactive substances, it is difficult to form a magnetic layer having a granular structure containing a carbide in a grain boundary.

Therefore, in the present embodiment, the following method is adopted as the method for forming the second magnetic layer 4b. That is, after forming a magnetic layer having a non-granular structure, by causing the magnetic layer having the non-granular structure to react with carbon and changing part of elements contained in the magnetic grains into a carbide, grain boundaries are formed, thereby forming the magnetic layer having the granular structure.

The carbide of the elements contained in the magnetic grains in the present embodiment preferably includes a carbide of boron, chrome, aluminum, tantalum, zirconium, or silicon.

Materials such as a CoCrPt based material, a CoCrPtB based material, a CoCrPtTa based material, a CoCrPtTi based material, a CoCrPtZr based material, a CoCrPtAl based material and a CoCrPtSi based material, are cited as a material that forms the magnetic layer having the non-granular structure according to the present embodiment.

Here, any of the materials that form the magnetic layer having the non-granular structure of the present embodiment is a material appropriate for a sputtering method.

Publicly known methods can be used as the method for causing the magnetic layer having the non-granular structure to react with carbon, but adopting a method of exposing the magnetic layer to reactive carbon plasma is preferable to reduce damage to the magnetic layer.

By causing the magnetic layer having the non-granular structure to react with carbon according to the present embodiment, part of the elements contained in the magnetic grains changes into a carbide, and the grain boundaries are formed, thereby causing the magnetic layer of the non-granular structure to become a magnetic layer having a granular structure. Because the carbide of the elements contained in the magnetic grains formed in this manner is stronger and more stable than carbide formed by sputtering, the corrosion resistance of the magnetic recording medium 10 can be improved.

For example, CoCrPt—CrC, CoCrPtB—BC, CoCrPtTa—TaC, CoCrPtTi—TiC, CoCrPtZr—ZrC, CoCrPtAl—AlC, CoCrPtSi—$Si_3C_4$ and the like can be cited as a material that forms the second magnetic layer 4b.

Moreover, for example, CoPt—CrC, CoCrPt—BC, CoCrPt—TaC, CoCrPt—TiC, CoCrPt—ZrC, CoCrPt—AlC, CoCrPt—$Si_3C_4$ and the like can be cited as a material that forms the second magnetic layer 4b when all of a specific element contained in the magnetic grains changes into a carbide.

In the present embodiment, by adopting the method of forming the magnetic layer of the granular structure by causing the magnetic layer of the non-granular structure to react with carbon and to change into a carbide, the second magnetic layer 4b, which is chemically more stable and has the corrosion resistance higher than the carbide in the magnetic layers of the granular structure formed by sputtering, can be readily formed. Moreover, a process of making a carbide can be performed for a shorter period of time than nitriding and the like, the productivity of the magnetic recording medium can be improved.

In the present embodiment, any magnetic layers or non-magnetic layers 7a, 7b, 7c, 7d and 7e are provided in the perpendicular magnetic layer 4, and forming the numerals 7a and 7c as magnetic layers and the numerals 7b, 7d and 7e as non-magnetic layers, is preferable. By using these layers, the magnetic grains or non-magnetic grains 41 form a columnar crystal that continues from the bottom layer to the top layer of the perpendicular magnetic layer 4.

Here, the number of any magnetic layers or non-magnetic layers can be increased or decreased as necessary.

Any magnetic layers preferably have a granular structure containing an oxide in grain boundaries similar to the first magnetic layer 4a.

A material that forms any magnetic layer is the same as that of the first magnetic layer 4a.

Any non-magnetic layers are provided between the magnetic layers to control to control an exchange coupling between the magnetic layers.

A material that forms any non-magnetic layers is preferred to be a material that has an hcp structure.

For example, Ru, a Ru alloy, a RuCo alloy, a CoCr alloy, a $CoCrX_1$ alloy ($X_1$ is one, two or more selected from Pt, Ta, Zr, Re, Ru, Cu, Nb, Ni, Mn, Ge, Si, O, N, W, Mo, Ti, V, Zr and B) can be cited as the material that forms any non-magnetic layer.

Moreover, a non-magnetic layer having a non-granular structure may be used as any non-magnetic layer.

The thickness of any non-magnetic layer needs to be set in a range where the non-magnetic layer does not completely break a ferromagnetic bond between the first magnetic layer 4a, the second magnetic layer 4b and any magnetic layer.

The protective layer 5 is to prevent corrosion of the perpendicular magnetic layer 4, and to prevent damage of a surface of the magnetic recording medium when a magnetic head touches the magnetic recording medium.

A material conventionally used can be used as a material that forms the protective film 5.

For example, a material containing a hard carbon film can be used as the protective film 5.

The thickness of the protective film 5 is preferably made in a range of 1 to 10 nm. Thus, a distance between the magnetic head and the magnetic recording medium can be made short, which makes it possible to form a magnetic recording medium appropriate for the increase in recording density.

A lubricant such as a perfluoropolyether, a fluorinated alcohol, a fluorinated carboxylic acid can be used as a material that forms the lubricating layer 6.

Figure 3:
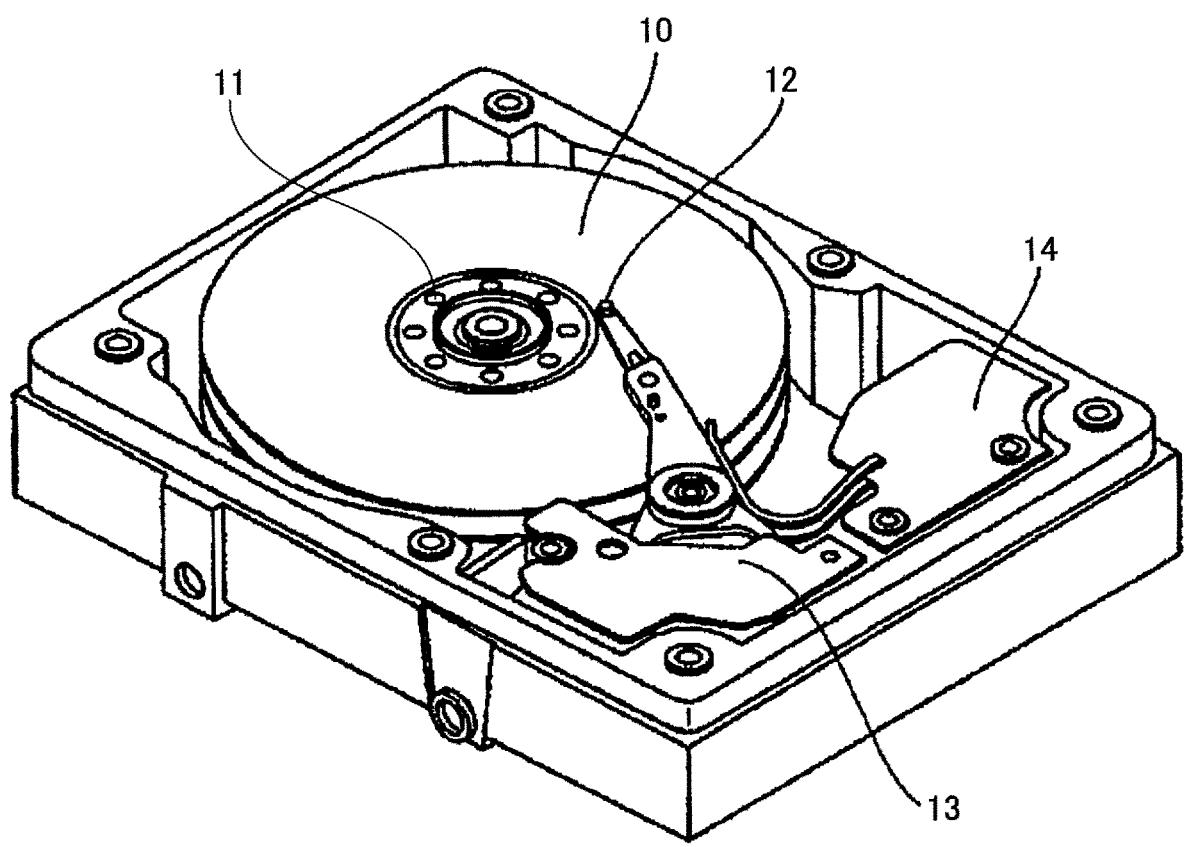
FIG. 3 is a schematic diagram illustrating an example of a magnetic recording and reproducing apparatus according to an embodiment.

FIG. 3 illustrates an example of a magnetic recording and reproducing apparatus according to an embodiment.

The magnetic recording and reproducing apparatus illustrated in FIG. 3 includes a magnetic recording medium 10 (see FIG. 1), a medium driver 11 that drives and rotates the magnetic recording medium 10, a magnetic head 12 that records information in the magnetic recording medium 10 and reproduce the information from the magnetic recording medium 10, a head driver 13 that moves the magnetic head 12 relative to the magnetic recording medium 10, and a recording and reproducing signal processing system 14.

The recording and reproducing signal processing system 14 is configured to be able to process data input from the outside and to send a recording signal to the magnetic head 12, and further to process a reproducing signal from the magnetic head 12 and to send data to the outside.

A magnetic head appropriate for recording density growth and having a giant magnetoresistance effect (GMR) device utilizing a giant magnetoresistance effect (GMR) can be used as a reproducing device of the magnetic head 12.

WORKING EXAMPLES

Working Example 1

A magnetic recording medium was produced by the following method. Here, with respect to components corresponding to the above-described embodiments, the same numerals as those of the above-described embodiments are attached to facilitate understanding of the following working examples.

After carrying a cleaned non-magnetic substrate 1 (manufactured by HOYA CORPORATION) made of glass and having a diameter of 2.5 inches into a film deposition chamber of a DC magnetron sputtering apparatus C-3040 (manufactured by CANON ANELVA CORPORATION) and evacuating the film deposition chamber to a degree of vacuum of $1 \times 10^{-5}$ Pa, an adhesion layer having a thickness of 10 nm was deposited on the non-magnetic substrate 1 using a target of Cr-50Ti (content of Ti was 50 at %, and the reset was Cr).

Next, a soft magnetic layer of a thickness of 25 nm was formed on the adherent layer by using a target of Co-20Fe-5Zr-5Ta (content of Fe was 20 at %; content of Zr was 5 at %; content of Ta was 5 at %; and the rest was Co) and setting a temperature of the non-magnetic substrate 1 at 100 C or lower. Subsequently, a Ru layer of a thickness of 0.7 nm was formed in the soft magnetic layer using a target of Ru. Furthermore, a soft magnetic layer of a thickness of 25 nm was formed on the Ru layer using a target of Co-20Fe-5Zr- 5Ta and setting a temperature of the non-magnetic substrate 1 at 100° C. or lower, and a soft magnetic underlayer 2 was formed.

Next, a Ni-6W (content of W was 6 at %, and the rest was Ni) layer having a thickness of 5 nm and a Ru layer having a thickness of 20 nm were formed on the soft magnetic underlayer 2 in this order using a target of Ni-6W and a target of Ru, respectively, and an orientation control layer 3 was formed.

Subsequently, a magnetic layer 7a having a granular structure and a thickness of 9 nm was formed in the orientation control layer 3 using a target of 91(Co15Cr18Pt)-6($SiO_2$)-3($TiO_2$) (content of Cr was 15 at %; content of Pt was 18 at %; content of the remaining Co alloy was 91 mol %, content of $SiO_2$ was 6 mol %; and content of $TiO_2$ was 3 mol %). At this time, the sputtering pressure was made 2 Pa.

Next, a non-magnetic layer 7b having a granular structure and a thickness of 0.3 nm was formed on the magnetic layer 7a using a target of 88(Co30Cr)-12($TiO_2$) (content of Cr was 30 at %; content of the remaining Co alloy was 8 mol %; and content of $TiO_2$ was 12 mol %).

Subsequently, a first magnetic layer 4a was formed on the non-magnetic layer 7b using a target of 92(Co11Cr18Pt)-5($SiO_2$)-3($TiO_2$) (content of Cr was 11 at %; content of Pt was 18 at %; content of the remaining Co alloy was 92 mol %; content of $SiO_2$ was 5 mol %; and content of $TiO_2$ was 3 mol %). At this time, the sputtering pressure was made 2 Pa.

Next, a non-magnetic layer 7e having a non-granular structure and a thickness of 0.3 nm was formed on the first magnetic layer 4a using a target of Ru.

Subsequently, a magnetic layer having a non-granular structure and a thickness of 10 nm was formed on the non-magnetic layer 7e using a target of Co10Cr20Pt14B (content of Cr was 10 at %; content of Pt was 20 at %; content of B was 14 at %; and the rest was Co). At this time, the sputtering pressure was made 0.6 Pa.

Next, the magnetic layer having the non-granular structure was caused to react with carbon by being exposed by reactive carbon plasma for 10 seconds, and a magnetic layer having a granular structure constituted of 97(Co12Cr22Pt2B)-3($B_4C$) (content of Cr was 12 at %; content of Pt was 22 at %; content of B was 2 at %; content of the remaining Co alloy was 93 mol %; and content of $B_4C$ was 3 mol %), that is, a second magnetic layer 4b was formed. At this time, the reactive carbon plasma was generated by supplying RF (radio frequency) power (500 W) to a mixed gas of toluene gas whose content was 5 volume % and argon gas whose content was 95 volume % generated by bubbling argon gas in toluene.

Subsequently, a protective layer 5 having a thickness of 3 nm was formed on the second magnetic layer 4b by using an ion beam method.

Next, a rubricating layer 6 made of a perfluoropolyether was formed on the protective layer 5 by using a dipping method, and a magnetic recording medium 10 was obtained.

Working Example 2

A magnetic recording medium 10 was obtained in a similar manner to the working example 1 except for forming a magnetic layer having a granular structure made of 93(Co12Cr22Pt7Ti)-7(TiC) using a target of Co10Cr20Pt14Ti when forming the second magnetic layer 4b.

Working Example 3

A magnetic recording medium 10 was obtained in a similar manner to the working example 1 except for forming a magnetic layer having a granular structure made of 93(Co12Cr22Pt2Al)-3($Al_4C_3$) using a target of Co10Cr20Pt14Al when forming the second magnetic layer 4b.

Working Example 4

A magnetic recording medium 10 was obtained in a similar manner to the working example 1 except for forming a magnetic layer having a granular structure made of 93(Co12Cr22Pt7Ta)-7(TaC) using a target of Co10Cr20Pt14Ta when forming the second magnetic layer 4b.

Working Example 5

A magnetic recording medium 10 was obtained in a similar manner to the working example 1 except for forming a magnetic layer having a granular structure made of 93(Co12Cr22Pt7Zr)-7(ZrC) using a target of Co10Cr20Pt14Zr when forming the second magnetic layer 4b.

Working Example 6

A magnetic recording medium 10 was obtained in a similar manner to the working example 1 except for forming a magnetic layer having a granular structure made of 93(Co12Cr22Pt7Si)-7(SiC) using a target of Co10Cr20Pt14Si when forming the second magnetic layer 4b.

Comparative Example 1

A magnetic recording medium 10 was obtained in a similar manner to the working example 1 except for forming a magnetic layer having a non-granular structure made of Co10Cr20Pt14B without exposing the magnetic layer having the non-granular structure to the reactive carbon plasma when forming the second magnetic layer 4b.

Comparative Example 2

A magnetic recording medium was obtained in a similar manner to the working example 1 except for forming a magnetic layer having a granular structure made of 92(Co11Cr18Pt)-5($SiO_2$)-3($TiO_2$) using a target of 92(Co11Cr18Pt)-5($SiO_2$)-3($TiO_2$) when forming the second magnetic layer 4b.

(Composition of First Magnetic Layer 4a and Second Magnetic Layer 4b)

Compositions of the first magnetic layer 4a and the second magnetic layer 4b were measured by using XPS (X-ray Photoelectron Spectroscopy).

Next, noise properties and corrosion resistance properties of the magnetic recording medium were measured.

(Noise Properties)

A SNR (signal/noise ratio, (S/N ratio)) was evaluated as recording and reproducing properties of the magnetic recording medium using a read/write analyzer RWA-1632 and a spin stand S1701MP (manufactured by Guzik Technical Enterprises).

(Corrosion Resistance Properties)

After leaving the magnetic recording medium in an environment of a temperature of 90° C. and a degree of humidity of 90% for 96 hours, the corrosion resistance properties of the magnetic recording medium were evaluated by counting the number of corrosion spots (number/surface) generated in a surface of the magnetic recording medium by using an optical surface inspection device.

The evaluation results of the noise properties and the corrosion resistance properties of the magnetic recording medium are shown in FIG. 4.

FIG. 4 indicates that the magnetic recording mediums of the working examples 1 through 6 are superior with respect to the noise properties and the corrosion resistance properties and are appropriate for an increase in recording density.

In contrast, the magnetic recording medium of the comparative example 1 is inferior with respect to the noise properties and is not appropriate for the increase in density because the outermost magnetic layer has the non-granular structure.

Moreover, although the magnetic recording medium of the comparative example 2 has the outermost magnetic layer having the granular structure, because the magnetic recording medium of the comparative example 2 contains silicon oxide and titanium oxide in grain boundaries, the corrosion resistance properties significantly decrease, thereby decreasing the noise properties and making the magnetic recording medium inappropriate for the increase in recording density.

Thus, as discussed above, the embodiments can provide a magnetic recording medium, a method for manufacturing a magnetic recording medium and a magnetic recording and reproducing apparatus that excel in noise properties and are appropriate for an increase in recording density.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A magnetic recording medium, comprising:
    a non-magnetic substrate;
    a soft magnetic underlayer provided over the non-magnetic substrate;
    an orientation control layer provided over the soft magnetic underlayer;
    a perpendicular magnetic layer provided over the orientation control layer;
    a protective layer over the perpendicular magnetic layer;
    a first magnetic layer provided in the perpendicular magnetic layer and having a granular structure that contains a magnetic grain and that contains an oxide in a non-magnetic grain boundary; and
    a second magnetic layer that contains a magnetic grain and is provided farthest from the non-magnetic substrate in the perpendicular magnetic layer, the second magnetic layer containing a non-magnetic segregant,
    wherein the second magnetic layer has a granular structure that contains a carbide of an element contained in the magnetic grain in a grain boundary,
    wherein the second magnetic layer is the farthest perpendicular magnetic layer underneath the protective layer, from the non-magnetic substrate, and
    wherein the magnetic grains are CoPt based magnetic grains and the oxide content in the first magnetic layer is from 3 to 18 mol %.

2. The magnetic recording medium as claimed in claim 1, wherein the element contained in the magnetic grain is boron, titanium, chrome, aluminum, tantalum, zirconium, or silicon.

3. The magnetic recording medium as claimed in claim 1, wherein the oxide is an oxide of silicon, chrome, titanium, aluminum, yttrium, boron, magnesium, tungsten, or cobalt.

4. A method for manufacturing a magnetic recording medium including a non-magnetic substrate, a soft magnetic underlayer, an orientation control layer, a perpendicular magnetic layer, and a protective layer arranged in this order, the method comprising:
    forming a first magnetic layer over the orientation control layer as part of the perpendicular magnetic layer by sputtering such that the first magnetic layer has a granular structure that contains a magnetic grain and that contains an oxide in a non-magnetic grain boundary;
    forming a second magnetic layer having a non-magnetic structure and containing a magnetic grain at a location farthest from the orientation control layer in the perpendicular magnetic layer by sputtering, the second magnetic layer containing a non-magnetic segregant; and
    changing part of an element contained in the magnetic grain into a carbide such that a grain boundary is formed and thereby the second magnetic layer has a granular structure by causing the second magnetic layer having the non-magnetic structure to react with carbon,
    wherein the magnetic grains are CoPt based magnetic grains and the oxide content in the first magnetic layer is from 3 to 18 mol %.

5. The method as claimed in claim 4, wherein the step of changing the part of the element into the carbide comprises changing part of an element of boron, titanium, chrome, aluminum, tantalum, zirconium, or silicon into the carbide.

6. The method as claimed in claim 4, wherein the step of forming the first magnetic layer comprises forming the first magnetic layer that contains the oxide of silicon, chrome, titanium, tantalum, aluminum, yttrium, boron, magnesium, tungsten, and cobalt in the grain boundary.

7. A magnetic recording and reproducing apparatus, comprising:
    a recording medium including:
        a non-magnetic substrate;
        a soft magnetic underlayer provided over the non-magnetic substrate;
        an orientation control layer provided over the soft magnetic underlayer;
        a perpendicular magnetic layer provided over the orientation control layer;
        a protective layer over the perpendicular magnetic layer;
        a first magnetic layer provided in the perpendicular magnetic layer and having a granular structure that contains a magnetic grain and that contains an oxide in a non-magnetic grain boundary; and
        a second magnetic layer that contains a magnetic grain and is provided farthest from the non-magnetic substrate in the perpendicular magnetic layer, the second magnetic layer containing a non-magnetic segregant,
        wherein the second magnetic layer has a granular structure that contains a carbide of an element contained in the magnetic grain in a grain boundary, and
        wherein the second magnetic layer is the farthest perpendicular magnetic layer underneath the protective layer, from the non-magnetic substrate; and wherein the magnetic grains are CoPt based magnetic grains and the oxide content in the first magnetic layer is from 3 to 18 mol %, and a magnetic head configured to record information in the recording medium and to reproduce the recorded information from the magnetic recording medium.

8. The magnetic recording medium as claimed in claim 1, wherein the protective layer is non-magnetic.

9. The magnetic recording and reproducing apparatus as claimed in claim 7, wherein the protective layer is non-magnetic.

* * * * *